United States Patent [19]
Isshiki et al.

[11] Patent Number: 5,958,176
[45] Date of Patent: Sep. 28, 1999

[54] ELECTRICAL PARTS AND METHOD FOR MANUFACTURING THE SAME

[75] Inventors: Minoru Isshiki; Katsutoshi Mine; Kimio Yamakawa, all of Chiba Prefecture, Japan

[73] Assignee: Dow Corning Toray Silicone Co., Ltd., Tokyo, Japan

[21] Appl. No.: 08/899,967

[22] Filed: Jul. 24, 1997

[30] Foreign Application Priority Data

Jul. 26, 1996 [JP] Japan .................................. 8-215187

[51] Int. Cl.⁶ .................................................. B27G 11/02
[52] U.S. Cl. ........................ 156/379.6; 156/329; 528/34; 528/40; 522/172
[58] Field of Search .................. 156/329, 379.6; 522/172; 528/34, 40

[56] References Cited

U.S. PATENT DOCUMENTS

| | | | |
|---|---|---|---|
| 4,122,246 | 10/1978 | Sierawski . | |
| 4,645,551 | 2/1987 | Adams et al. | 156/82 |
| 5,292,787 | 3/1994 | Griswold et al. | 528/40 |
| 5,440,001 | 8/1995 | Griswold et al. | 528/40 |

FOREIGN PATENT DOCUMENTS

| | | |
|---|---|---|
| 510608 | 10/1992 | European Pat. Off. . |
| 599532 | 1/1994 | European Pat. Off. . |
| 596534 | 11/1994 | European Pat. Off. . |
| 768342 | 10/1995 | European Pat. Off. . |
| 64-27249 | 1/1989 | Japan . |
| 1-94679 | 4/1989 | Japan . |
| 2-27756 | 1/1990 | Japan . |
| 3-22553 | 1/1991 | Japan . |

OTHER PUBLICATIONS

Encyclopedia of Polymer Science and Engineering, vol. 15, pp. 252 & 254 (1989).

*Primary Examiner*—Melvyn I. Marquis
*Attorney, Agent, or Firm*—Larry A. Milco

[57] ABSTRACT

An electrical part containing an electrical element, a cured silicone resin which has been treated with ultraviolet light, a cured sealing resin which has been integrally bonded to the UV treated silicone resin. The cured silicone resin is prepared from an addition reaction curable silicone composition which is a mixture or reaction mixture of (a) an organosiloxane which has silanol groups and (b) an alkoxysilane which has epoxy groups, and/or (c) an organosiloxane which can be expressed by the average unit formula

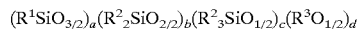

$$(R^1SiO_{3/2})_a(R^2{}_2SiO_{2/2})_b(R^2{}_3SiO_{1/2})_c(R^3O_{1/2})_d$$

wherein $R^1$ is an epoxy group containing monovalent organic group $R^2$ is monovalent hydrocarbon group, $R^3$ is a hydrogen atom or an alkyl group with 1 to 4 carbon atoms, a, b and d are>0 and c is≧0.

A method for manufacturing an electrical part containing the steps (I) covering an electrical element with the above mentioned silicone composition; (ii) curing the silicone composition to form a cured silicone resin; (iii) subjecting the cured silicone resin to ultraviolet irradiation treatment; and (iv) sealing the cured silicone resin with a sealing resin.

17 Claims, 2 Drawing Sheets

ELECTRICAL PARTS AND METHOD FOR MANUFACTURING THE SAME

BACKGROUND OF INVENTION

1. Field of the Invention

The present invention concerns an electrical part and a method for manufacturing the same. more specifically, the present invention concerns (a) an electrical part with superior reliability in which a cured silicone resin which covers an electrical element is bonded to a sealing resin which covers said cured silicone resin; and (b) an efficient method for manufacturing such an electrical part.

2. Description of the Related Art

Electrical elements such as IC's, hybrid IC's, LSI's, transistors, diodes, capacitors and resistors, etc., are generally covered with a sealing resin in order to protect such elements from external stresses such as bending and impacts, and to prevent water from penetrating into such elements. In order to protect an electrical element from internal stresses caused by the expansion and contraction of a the sealing resin, the elements may be covered with a cured silicone resin. In such electrical parts, however, the cured silicone resin is not bonded to the sealing resin. As a result, the reliability of such resin-sealed electrical parts is poor.

In order to solve this problem, many electrical parts have been proposed in which the surface of the cured silicone resin is subjected to an ultraviolet irradiation treatment, and this ultraviolet irradiation treated cured silicone resin is resin-sealed by means of a sealing resin, so that the cured silicone resin covering the electrical element is integrally bonded to the cured sealing resin. (see Japanese Patent Application Kokai No. 62-500106, Japanese Patent Application Kokai No. 64-27249, Japanese Patent Application Kokai No. 1-94679, Japanese Patent Application Kokai No. 2-27756 and Japanese Patent Application Kokai No. 3-22553).

However, even in these electrical parts, the cured silicone resin covering the electrical element is not sufficiently bonded to the cured sealing resin. As a result, the reliability of such resin-sealed electrical parts is unsatisfactory.

The object of the present invention is to provide (a) an electrical part with superior reliability in which a cured silicone resin which covers an electrical element is integrally bonded to and integrated with a cured sealing resin which covers the aforementioned cured silicone resin, and (b) an efficient method for manufacturing such an electrical part.

SUMMARY OF THE INVENTION

The electrical part of the present invention is characterized by the fact that the surface of a cured silicone resin which covers an electrical element is subjected to an ultraviolet irradiation treatment, said ultraviolet irradiation treated cured silicone resin is integrally bonded to a cured sealing resin which covers the surface of said cured silicone resin, and the aforementioned cured silicone resin is formed by curing an addition reaction curable silicone composition which contains a mixture or reaction mixture of (a) an organosiloxane which has silanol groups and (b) an alkoxysilane which has epoxy groups, and/or (c) an organosiloxane which can be expressed by the average unit formula

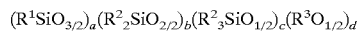

wherein $R^1$ indicates a monovalent organic group containing an epoxy group; $R^2$ indicates a substituted or unsubstituted monovalent hydrocarbon groups which may be the same or different, $R^3$ indicates a hydrogen atom or an alkyl group with 1 to 4 carbon atoms; a, b and d are respective positive numbers; and c is 0 or a positive number.

Furthermore, the method of the present invention for manufacturing an electrical part is characterized by the fact that an electrical element is covered with an addition reaction curable silicone composition which contains a mixture or reaction mixture of (a) an organosiloxane which has silanol groups and (b) an alkoxysilane which has epoxy groups, and/or (c) an organosiloxane which can be expressed by the average unit formula

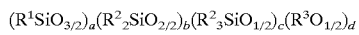

wherein $R^1$, $R^2$, $R^3$, a, b, d and c are as described above; and after which the surface of the cured silicone resin obtained by curing said composition is subjected to an ultraviolet irradiation treatment, and said ultraviolet irradiation treated cured silicone resin is resin-sealed by means of a sealing resin.

DETAILED DESCRIPTION OF THE INVENTION

First, the electrical part of the present invention will be described in detail.

Figure 1:
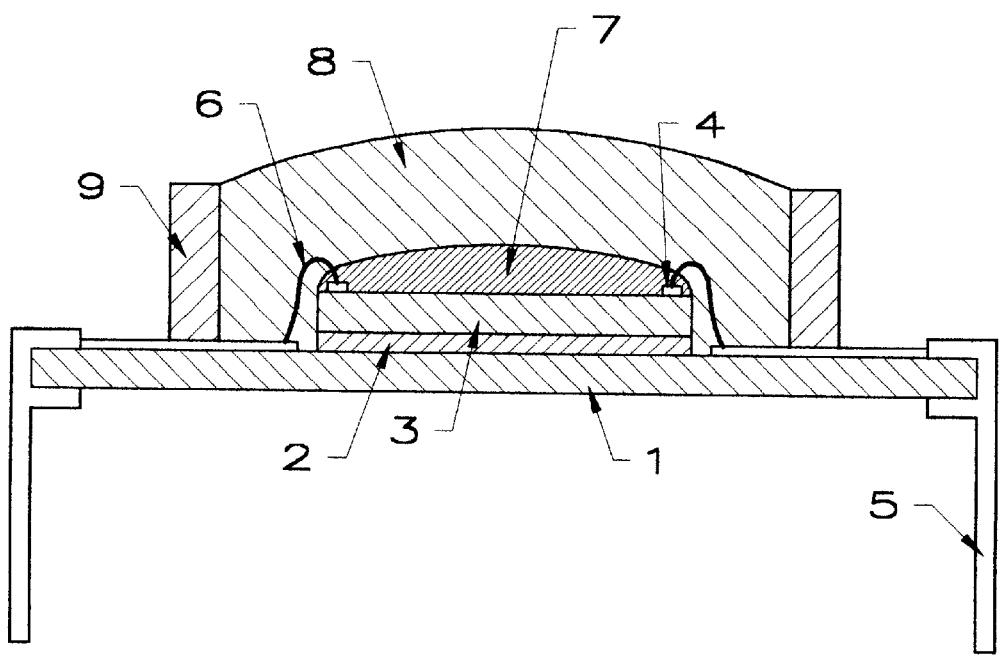
FIG. 1 is a sectional view of a semiconductor device constituting an electrical part of the present invention.
Figure 2:
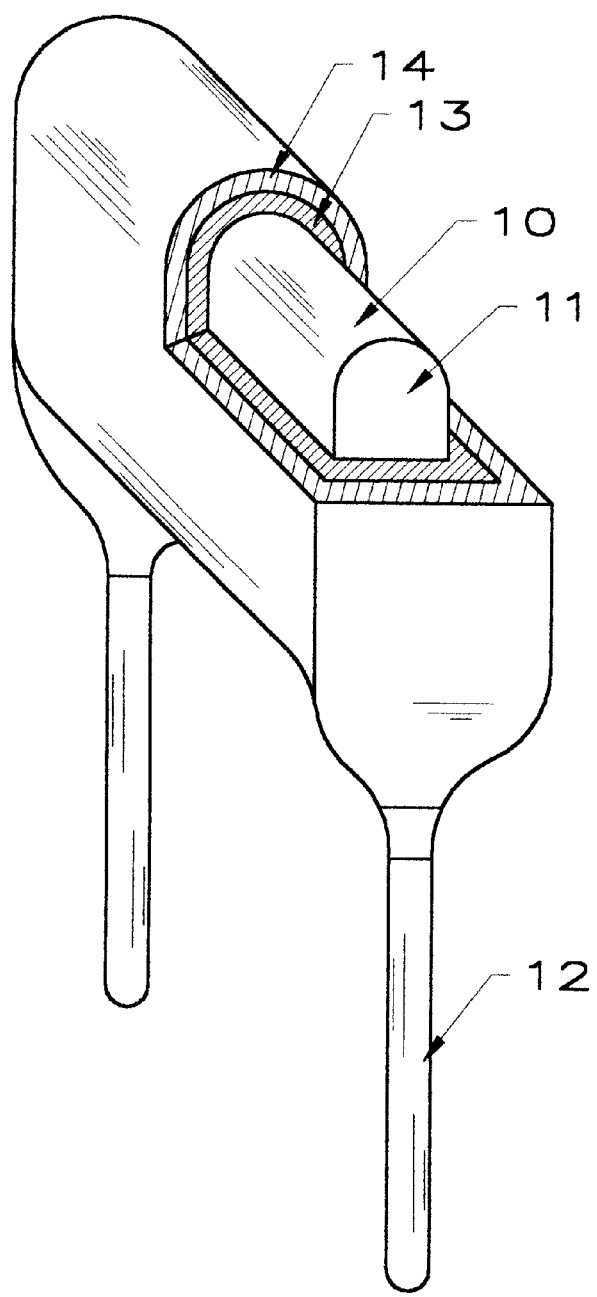
FIG. 2 is a partially sectional perspective view of a capacitor constituting an electrical part of the present invention.

The electrical part of the present invention is characterized by the fact that a cured silicone resin which covers the electrical part is integrally bonded to a cured sealing resin which covers the surface of said cured silicone resin. The electrical part contains an electrical element. The term "electrical element" is used herein to describe electrical elements such as transistors, resistors, capacitors, diodes, etc.; electrical devices containing such electrical elements, semiconductor elements such as IC's, hybrid IC's, LSI's, etc.; and semiconductor devices containing such semiconductor elements. As the electrical element in the present invention, semiconductor devices and capacitors are especially desirable. Such a semiconductor device is shown in FIG. 1, and an example of a capacitor is shown in FIG. 2.

First, the semiconductor device shown in FIG. 1 will be described in detail. In this semiconductor device, a semiconductor element 3 is mounted on a circuit board 1 via a bonding agent 2. Bonding pads 4 are installed on the upper end portions of the semiconductor element 3, and external leads 5 are installed on the end portions of the circuit board 1. The bonding pads 4 are electrically connected to the circuit board 1 by bonding wires 6. The semiconductor element 3 is covered by a cured silicone resin 7, and the cured resin 7 is covered by a cured sealing resin 8. Furthermore, a frame 9 is installed around the periphery of the semiconductor element 3 in order to prevent the sealing resin from flowing out. Moreover, the surface of the cured silicone resin 7 is subjected to an ultraviolet irradiation treatment, and this cured silicone resin 7 is thoroughly bonded to and integrated with the cured sealing resin 8 covering said cured silicone resin 7.

Next, the capacitor shown in FIG. 2 will be described in detail. In this capacitor, a capacitor in which a polyester film 10 on which aluminum has been vacuum-evaporated (metallized) is wrapped or laminated, and in which electrodes 11 formed by covering both ends of said wrapped or laminated film with a flame-coated metal are electrically connected to external leads 12, is covered by a cured silicone resin 13, and this cured resin 13 is covered by a cured sealing resin 14. Furthermore, the surface of the cured silicone resin 13 is subjected to an ultraviolet irradiation treatment, and this cured silicone resin 13 is thoroughly bonded to and integrated with the cured sealing resin 14 which covers said cured silicone resin 13.

The electrical part of the present invention is characterized by the fact that in the above mentioned electrical parts, the cured silicone resin 7 or 13 which covers the electrical element, i. e., the aforementioned semiconductor element or capacitor, etc., is formed by curing an addition reaction curable silicone composition which contains a mixture or reaction mixture of (a) an organosiloxane which has silanol groups and (b) an alkoxysilane which has epoxy groups, and/or (c) an organosiloxane which can be expressed by the average unit formula $$(R^1SiO_{3/2})_a(R^2{}_2SiO_{2/2})_b(R^2{}_3SiO_{1/2})_c(R^3O_{1/2})_d$$

wherein $R^1$, $R^2$, $R^3$, a, b, d and c are as described above.

A preferred embodiment of the above mentioned addition reaction curable silicone composition is a composition comprising:

(A) an organopolysiloxane which has at least two alkenyl groups bonded to silicon atoms in each molecule;

(B) an organohydrogenpolysiloxane which has at least two hydrogen atoms bonded to silicon atoms in each molecule;

(C) an addition reaction catalyst; and (D) a mixture or a reaction mixture of (a) an organosiloxane which has silanol groups and (b) an alkoxysilane which has epoxy groups, and/or (c) an organosiloxane which can be expressed by the average unit formula $$(R^1SiO_{3/2})_a(R^2{}_2SiO_{2/2})_b(R^2{}_3SiO_{1/2})_c(R^3O_{1/2})_d$$

wherein $R^1$, $R^2$, $R^3$, a, b, d and are as described above.

The organopolysiloxane of component (A) is the main ingredient of the above mentioned composition, and is characterized by the fact that said organopolysiloxane has at least two silicon-bonded alkenyl groups per molecule. Examples of alkenyl groups which can be used in component (A) include vinyl groups, allyl groups, butenyl groups, pentenyl groups, hexenyl groups and heptenyl groups. The bonding positions of the alkenyl groups may be on the ends of the molecular chains and/or on molecular side chains. Furthermore, examples of groups other than alkenyl groups which can be bonded to silicon atoms in component (A) include substituted or unsubstituted monovalent hydrocarbon groups, e. g., alkyl groups such as methyl groups, ethyl groups, propyl groups, butyl groups, pentyl groups, hexyl groups and heptyl groups, etc.; aryl groups such a phenyl groups, tolyl groups, xylyl groups and naphthyl groups, etc.; aralkyl groups such as benzyl groups and phenethyl groups, etc.; and halogenated alkyl groups such as chloromethyl groups, 3-chloropropyl groups and 3,3,3-trifluoro-propyl groups, etc. Furthermore, the molecular structure of component (A) may be a linear structure, a linear structure with some branching, a branched structure, a cyclic structure or a net-form structure. Moreover, it is desirable that the viscosity of component (A) at 25° C. be in the range of 5 to 1,000,000 centipoise (mPa.s.).

The organohydrogenpolysiloxane of component (B) is a cross linking agent for the above mentioned composition, and is characterized by the fact that said organohydrogenpolysiloxane has at least two silicon-bonded hydrogen atoms per molecule. The bonding positions of these silicon-bonded hydrogen atoms may be on the ends of the molecular chains and/or on molecular side chains. Furthermore, examples of groups other than hydrogen atoms which can be bonded to silicon atoms in component (B) include substituted or unsubstituted monovalent hydrocarbon groups as described above. The molecular structure of component (B) may be a linear structure, a linear structure with some branching, a branched structure, a cyclic structure or a net-form structure. Moreover, it is desirable that the viscosity of component (A) at 25° C. be in the range of 1 to 100,000 centipoise (mPa.s.). The amount of component (B) that is added to the composition of the present invention is an amount which is sufficient to cause curing of the composition. It is desirable that the amount added be an amount which is such that the molar ratio of silicon-bonded hydrogen atoms in component (B) to silicon-bonded alkenyl groups in component (A) is from 0.4 to 10. A molar ratio is from 0.5 to 3.0 is even more desirable. If the molar ratio of silicon-bonded hydrogen atoms in component (B) to silicon-bonded alkenyl groups in component (A) less than 0.4, the above mentioned composition tends to show insufficient curing. If the above mentioned molar ratio exceeds 10, the mechanical strength of the cured silicone resin obtained is reduced.

The addition reaction catalyst of component (C) is used to promote the curing of the above mentioned composition. Examples of catalysts which can be used include platinum type catalysts such as platinum black, finely powdered silica on which platinum is supported, active carbon on which platinum is supported, alcohol solutions of chloroplatinic acid, olefin complexes of platinum and alkenylsiloxane complexes of platinum, etc., as well as rhodium type catalysts and palladium type catalysts. The amount of component (C) that is added to the composition is a catalytic amount; for example, it is desirable that the amount added be an amount such that the metal concentration is 0.1 to 1,000 ppm (in weight units) relative to the above mentioned composition.

Component (D) is a component which is used to insure sufficient bonding of the ultraviolet irradiation treated cured silicone resin with the cured sealing resin. This component is a mixture or reaction mixture components (a) and (b), and/or (c).

Component (a) is a silanol group containing organosiloxane. A silanol group is a hydroxy group bonded to a silicon atom. In preferred embodiments, component (a) is an organosiloxane having an average of at least two silanol groups per molecule. The molecular structure of component (a) may be a linear structure, a linear structure with some branching, a branched structure, a cyclic structure or a net-form structure. A linear structure is especially desirable. Examples of organic groups which may be bonded to the silicon atoms in component (a) include substituted or unsubstituted monovalent hydrocarbon groups, e. g., alkyl groups such as methyl groups, ethyl groups, propyl groups, butyl groups, pentyl groups, hexyl groups and heptyl groups, etc.; aryl groups such a phenyl groups, tolyl groups, xylyl groups and naphthyl groups, etc.; aralkyl groups such as benzyl groups and phenethyl groups, etc.; and halogenated alkyl groups such as chloromethyl groups, 3-chloropropyl groups and 3,3,3-trifluoropropyl groups, etc. In particular, methyl groups, vinyl groups and phenyl groups are especially desirable. Examples of compounds which can be used as component (a) include silanol-terminated dimethylpolysiloxanes, silanol-terminated dimethylsiloxane-methylvinylsiloxane copolymers and silanol-terminated dimethylsiloxane-methylphenylsiloxane copolymers.

Component (b) is an epoxy group containing alkoxysilane. Examples of such alkoxysilanes include alkoxysilanes having by the general formula $$R^1Si(OR^4)_3$$

wherein $R^1$ is as described above. In preferred embodiments, $R^1$ is selected from the group consisting of glycidoxyalkyl groups, epoxycyclohexylalkyl groups and oxiranylalkyl groups. Preferred glycidoxyalkyl groups include 3-glycidoxypropyl groups and 4-glycidoxybutyl groups. Preferred epoxycyclohexylalkyl groups include 2-(3,4-epoxycyclohexyl)ethyl groups and 3-(3,4-epoxycyclohexyl)propyl groups. Preferred oxiranylalkyl groups include 4-oxiranylbutyl groups and 8-oxiranyloctyl groups. Glycidoxyalkyl groups (such as 3-glycidoxypropyl groups) are especially desirable. Furthermore, $R^4$ in the above formula is an alkyl group with 1 to 4 carbon atoms, e. g., a methyl group, ethyl group, propyl group or butyl group. In particular, a methyl group is especially desirable. Examples of compounds which can be used as component (b) include 3-glycidoxypropyltrimethoxysilane, 2-(3,4-epoxycyclohexyl)ethyltrimethoxysilane, 4-oxiranylbutyltrimethoxysilane and 8-oxiranyloctyltrimethoxysilane. In particular, 3-glycidoxypropyltrimethoxysilane is especially desirable.

Components (a) and (b) may be simply mixed, or may be caused to undergo a condensation reaction or an equilibrium reaction. It is desirable that the weight ratio of component (a) to component (b) be from 0.1:1 to 1:10.

The organosiloxane of component (c) is expressed by the average unit formula $$(R^1SiO_{3/2})_a(R^2_2SiO_{2/2})_b(R^2_3SiO_{1/2})_c(R^3O_{1/2})_d$$

wherein $R^1$, $R^2$, $R^3$, a, b, c and d are as described above. In preferred embodiments, $R^2$ is selected from the group consisting of alkyl groups, alkenyl groups, aryl groups, aralkyl groups and halogenated alkyl groups. Preferred alkyl groups include methyl groups, ethyl groups, propyl groups, butyl groups, pentyl groups, hexyl groups and heptyl groups. The preferred alkenyl group is a vinyl group. Preferred aryl groups include phenyl groups, tolyl groups, xylyl groups and naphthyl groups. Preferred aralkyl groups include benzyl groups and phenethyl groups. Preferred halogenated alkyl groups include chloromethyl groups, 3-chloropropyl groups and 3,3,3-trifluoropropyl groups, In particular, methyl groups, vinyl groups and phenyl groups are especially desirable. $R^3$ is preferably selected from the group consisting of methyl groups, ethyl groups, propyl groups and butyl groups. In particular, methyl groups are especially desirable.

One example of a method which can be used to prepare component (c) is a method in which a linear or cyclic diorganosiloxane and an alkoxysilane containing epoxy groups are subjected to equilibrium polymerization in the presence of a polymerization catalyst such as sodium hydroxide, etc.

There are no particular restrictions on the amount of component (D) that is added to the above mentioned composition, as long as said amount is such that the adhesion of the resulting silicone resin to the sealing resin is sufficient. However, it is desirable that the content of component (D) in the composition be from 0.01 to 20 wt % (preferably from 0.1 to 20 wt %, and even more preferably from 0.1 to 10 wt %). If the amount of component (D) that is added is less than 0.01 wt. %, it becomes difficult to achieve the object of the present invention. If the amount added exceeds 20 wt. %, the mechanical strength of the cured silicone resin obtained is reduced.

Optional components which may be added to the above mentioned composition include addition reaction inhibiting agents, e. g., acetylene type compounds such as 3-methyl-1-butyn-3-ol, 3,5-dimethyl-1-hexyn-3-ol and 3-phenyl-1-butyn-3-ol, etc., "enyne" type compounds such as 3-methyl-3-penten-1-yne and 3,5-dimethyl-3-hexen-1-yne, etc., siloxane compounds containing alkenyl groups such as 1,3,5,7-tetramethyl-1,3,5,7-tetravinylcyclotetrasiloxane and 1,3,5,7-tetramethyl-1,3,5,7-tetrahexenylcyclotetrasiloxane, etc., and triazole compounds such as benzotriazole, etc. It is desirable that such addition reaction inhibiting agents be added at the rate of 10 to 5,000 ppm (in weight units) relative to the above mentioned composition.

Examples of other optional components which may be contained in the above mentioned composition include fiber-form fillers such as glass fibers, asbestos, alumina fibers, ceramic fibers containing alumina and silica components, boron fibers, zirconia fibers, silicon carbide fibers, metal fibers, phenol fibers, aramide fibers, nylon fibers, polyester fibers and natural animal or vegetable fibers, etc.; inorganic fillers such as fused silica, precipitated silica, fumed silica, calcined silica, zinc oxide, calcined clay, carbon black, glass beads, alumina, talc, calcium carbonate, clay, alumina hydroxide, barium sulfate, titanium dioxide, titanium oxide, aluminum nitride, silicon carbide, magnesium oxide, beryllium oxide, cerium oxide, kaolin, mica, zirconia and metallic silicon, etc.; organic fillers such as epoxy resins, nylon resins, phenol resins, polyester resins, fluororesins and silicone resins, etc.; organic solvents such as xylene, toluene and heptane, etc.; and other additives such as dyes, heat-resistant additives, thickeners, and pigments, etc.

Next, the method of the present invention for manufacturing an electrical part will be described in detail.

First, in the manufacturing method of the present invention, a semiconductor element such as an IC, hybrid IC or LSI, etc., or an electrical element such as a transistor, diode, capacitor or resistor, etc., is covered by an addition reaction curable silicone composition which contains a mixture or reaction mixture of (a) an organosiloxane which has silanol groups and (b) an alkoxysilane which has epoxy groups, and/or (c) an organosiloxane which can be expressed by the average unit formula $$(R^1SiO_{3/2})_a(R^2_2SiO_{2/2})_b(R^2_3SiO_{1/2})_c(R^3O_{1/2})_d$$

wherein $R^1$, $R^2$, $R^3$, a, b, c and d are as described above. In cases where a semiconductor device such as that shown in FIG. 1 is being manufactured as the electrical part in question, it is first necessary to mount a semiconductor element 3 on a circuit board 1 via a bonding agent 2, and to form electrical connections between the circuit board 1 and the bonding pads 4 located on the upper end portions of the semiconductor element 3 by means of bonding wires 6. Furthermore, in cases where a resin which possesses fluidity is used as the sealing resin, it is desirable to install a frame 9 around the periphery of the semiconductor element 3 in order to prevent the sealing resin from flowing out. Meanwhile, in cases where a capacitor such as that shown in FIG. 2 is being manufactured as the electrical part in question, it is first necessary to wrap or laminate a polyester film 10 on which aluminum has been vacuum-evaporated (metallized), and then to form electrodes 11 by covering both ends of the aforementioned wrapped or laminated film 10 with a flame-coated metal; afterward, external leads 12 must be electrically connected to these electrodes 11.

The addition reaction curable silicone composition which is used to cover the above mentioned electrical elements is the same as described above. Methods which can be used to apply this composition to the electrical element include potting, casting, dip coating, drip coating by means of a dispenser, etc., spray coating and brush coating. Furthermore, in regard to the method used in order to cure the composition on the electrical element, it would also be possible to cure the composition by allowing the coated element to stand at room temperature; generally, however, it is desirable to heat the composition to a temperature of 50 to 250° C. For example, this heating can be accomplished by means of an oven, hot plate or heat lamp, or by means of the radiant heat that is generated during the aforementioned ultraviolet irradiation treatment.

After the silicone compositions cured, it is irradiated with ultraviolet light. Examples of methods which can be used in order to perform an ultraviolet irradiation treatment on the surface of the cured silicone resin covering the electrical element include methods using light sources such as an ultra-high-pressure mercury lamp, high-pressure mercury lamp, low-pressure mercury lamp, xenon-mercury lamp or metal halide lamp, etc. Furthermore, in regard to the conditions of this ultraviolet irradiation treatment, it is desirable that the conditions used be such that the amount of irradiation at 254 nm is from 0.01 to 10 J/cm$^2$. If necessary, furthermore, an optical filter (used for ultraviolet irradiation at a specified wavelength), a thermal radiation cutting filter or a thermal radiation cutting reflective mirror may be installed on the light source when the cured silicone resin is subjected to the above mentioned ultraviolet irradiation treatment. Moreover, this ultraviolet irradiation treatment may be performed while cooling the cured silicone resin by means of an air cooling fan or water cooling system.

Next, the cured silicone resin which has been subjected to the above mentioned ultraviolet irradiation treatment is resin-sealed by means of a sealing resin. Examples of sealing resins which can be used in this case include curable epoxy resins, curable phenol resins, curable polyphenylene sulfide resins, curable polyether resins and curable polyimide resins. In particular, curable epoxy resins are especially desirable. Examples of such curable epoxy resins include glycidyl ether type epoxy resins such as bisphenol A type epoxy resins, bisphenol F type epoxy resins, biphenyl type epoxy resins, phenol novolak type epoxy resins, orthocresol novolak type epoxy resins and brominated epoxy resins, etc.; alicyclic epoxy resins; glycidyl ester type epoxy resins; glycidylamine type epoxy resins; and heterocyclic epoxy resins. Examples of curing mechanisms which may be used in the case of these curable epoxy resins include heat-curability, ultraviolet-curability and moisture-curability; however, heat-curability is especially desirable. Furthermore, the above mentioned curable epoxy resins may be liquid at room temperature, or may be solid resins which have a softening point above room temperature; however, from the standpoint of handling and working characteristics, it is desirable that the resin used be a resin which is liquid at room temperature. Methods which can be used to apply this sealing resin to the aforementioned cured silicone resin include transfer molding, injection molding, potting, casting, dip coating, drip coating by means of a dispenser, etc., spray coating and brush coating. Furthermore, methods which can be used to cure this sealing resin on the aforementioned cured silicone resin include methods in which said sealing resin is heated to a temperature of 50 to 250° C. (in cases where the sealing resin used in heat-curable), methods in which the sealing resin is irradiated with ultraviolet light by means of the aforementioned light source (in cases where the sealing resin used is ultraviolet-curable), and methods in which the sealing resin is allowed to stand at room temperature (in cases where the sealing resin is moisture-curable). Means which can be used to heat the resin include (for example) an oven, hot plate or heat lamp.

PRACTICAL EXAMPLES OF APPLICATION

Next, the electrical part of the present invention and the method of the present invention for manufacturing the same will be described in detail in terms of practical examples of application. Furthermore, viscosity values cited in these practical examples are values measured at 25° C. Moreover, the adhesion of the cured sealing resin to the cured silicone resin and the reliability of the electrical part (semiconductor device or capacitor) were evaluated as described below.

Preparation of Sealing Resin

The sealing resin used in the practical examples was prepared as follows:

A curable epoxy resin composition was prepared by uniformly mixing 100 parts by weight of an epoxy resin consisting principally of a bisphenol F type epoxy resin (epoxy equivalents=165), 120 parts by weight of a tetraalkyltetrahydrophthalic anhydride (molecular weight=234) used as a curing agent, and I part by weight of 1-isobutyl-3-methylimidazole (used as a curing accelerating agent). This composition was used as the sealing resin.

Adhesion of Cured Sealing Resin to Cured Silicone Resin

The curable silicone composition was applied to the surface of an aluminum plate, and was cured by being heated for 5 minutes in a hot air draft circulation type oven at 100° C. Next, the cured silicone resin thus obtained was subjected to ultraviolet irradiation by means of an ultraviolet irradiating device (high-pressure mercury lamp, lamp power=120 W/cm) so that the amount of irradiation at a wavelength of 254 nm was 0.2 J/cm$^2$. Afterward, the sealing resin was applied to the surface of the ultraviolet irradiation treated cured silicone resin, and was cured by being heated for 4 hours in a hot air draft circulation type oven at 120° C. The adhesion of the cured sealing resin to the cured silicone resin was observed; cases where the adhesion was strong were indicated by a circle, cases where some peeling occurred were indicated by a triangle, and cases where complete peeling occurred were indicated by an X.

Reliability of Electronic Part (Semiconductor Device)

A semiconductor device of the type shown in FIG. 1 was constructed as follows:

A semiconductor element 3 which had an aluminum wiring pattern formed on its surface was mounted by means of a bonding agent 2 on the surface of a circuit board 1 made of an alumina ceramic. Afterward, bonding pads 4 located on the upper end portions of the semiconductor element 3 were electrically connected to the circuit board 1 by means of metal bonding wires 6. Next, the surface of this semiconductor element 3 was coated with a curable silicone composition by means of a dispenser, and a cured silicone resin 7 was formed by heating for 5 minutes in a hot air draft circulation type oven at 100° C. Next, the surface of this cured silicone resin 7 was irradiated with ultraviolet light by means of an ultraviolet irradiating device (high-pressure mercury lamp, lamp power=120 W/cm) so that the amount of irradiation at a wavelength of 254 nm was 0.2 J/cm$^2$. Afterward, a sealing resin was applied by means of a dispenser to the surface of the ultraviolet irradiation treated cured silicone resin 7. Since this sealing resin possessed fluidity, a rubber frame 9 with a height of 1 mm was installed around the periphery of the semiconductor element 3 beforehand. Next, this assembly was heated for 4 hours in a hot air draft circulation type oven at 120° C., so that a cured sealing resin 8 was formed on the surface of the cured silicone resin 7, thus completing the semiconductor device. 20 samples of this semiconductor device were manufactured in the same manner.

These semiconductor devices were subjected to 100 cycles of a thermal cycle test in which one cycle consisted of 30 minutes at a temperature of −30° C. followed by 30 minutes at a temperature of +100° C. The rate of defective operation of the semiconductor devices following this thermal cycle test was determined.

Reliability of Electrical Part (Capacitor)

A capacitor of the type shown in FIG. 2 was constructed as follows:

A polyester film 10 on which aluminum was vacuum-evaporated (metallized) was wrapped into a roll, and both ends of this roll were covered by a flame-coated metal so that electrodes 11 were formed. External leads 12 were then electrically connected to these electrodes 11. Next, this assembly was dipped in a curable silicone composition, and the coated assembly was heated for 5 minutes in a hot air draft circulation type oven at 100° C. so that a cured silicone resin 13 was formed. Next, the surface of this cured silicone resin 13 was irradiated with ultraviolet light by means of an ultraviolet irradiating device (high-pressure mercury lamp, lamp power=120 W/cm) so that the amount of irradiation at a wavelength of 254 nm was 0.2 J/cm$^2$. Afterward, this ultraviolet irradiation treated cured silicone resin 13 was dipped in a sealing resin, and the resulting assembly was heated for 4 hours in a hot air draft circulation type oven at 120° C. so that a cured sealing resin 14 was formed on the surface of the cured silicone resin 13, thus completing the capacitor. 20 samples of this capacitor were manufactured in the same manner.

These capacitors were subjected to a moisture resistance test in which the capacitors were allowed to stand for 1000 hours at 40° C. in an atmosphere with a relative humidity of 95%. The rate of defective operation of the capacitors following this moisture resistance test was determined.

Reference Example 1

116 g of 1,3,5,7-tetramethyl-1,3,5,7-tetravinylcyclo-tetrasiloxane, 100 g of 3-glycidoxypropyltrimethoxysilane and
0.05 g of potassium hydroxide were placed in a four-necked flask equipped with an agitator, a thermometer and a reflux condenser, and these ingredients were subjected to equilibrium polymerization for 3 hours while being heated and agitated at 120 ° C. Afterward, this reaction was stopped with dimethyldichlorosilane. This reaction mixture was distilled under reduced pressure (100° C., 5 mmHg) so that the low-boiling-point components were removed. As a result, a liquid-form substance was obtained. When this liquid-form substance was analyzed by Fourier transform nuclear magnetic resonance analysis, it was confirmed that said substance was an organopolysiloxane expressed by the following average unit formula (1)

Practical Example 1

A curable silicone composition was prepared by uniformly mixing 96.9 parts by weight of a dimethylvinylsiloxy-terminated dimethylpolysiloxane (viscosity: 400 centipoise (mPa.s.), 2.0 parts by weight of a trimethylsiloxy-terminated dimethylsiloxane-methylhydrogensiloxane copolymer (viscosity: 5 centipoise (mPa.s.), 0.5 parts by weight of 3-glycidoxypropyltrimethoxysilane, 0.5 parts by weight of a silanol-terminated dimethylsiloxane-methylvinylsiloxane copolymer (viscosity: 25 centipoise (mPa.s.), 0.1 parts by weight of a 1 wt % isopropyl alcohol solution of chloroplatinic acid, and 0.01 parts by weight of 3-phenyl-1-butyn-3-ol (used as an addition reaction inhibiting agent).

Using this curable silicone composition, the above mentioned adhesion of the cured sealing resin to the cured silicone resin and reliability of the electronic part (semiconductor device or capacitor) were evaluated. The evaluation results are shown in Table 1.

Practical Example 2

A curable silicone composition was prepared in the same manner as in Practical Example 1, except that 1.0 parts by weight of the organopolysiloxane prepared in Reference Example 1 was used instead of the 0.5 parts by weight of 3-glycidoxypropyltrimethoxysilane and 0.5 parts by weight of a silanol-terminated dimethylsiloxane-methylvinylsiloxane copolymer (viscosity: 25 centipoise (mPa.s.) used in Practical Example 1.

Using this curable silicone composition, the above mentioned adhesion of the cured sealing resin to the cured silicone resin and reliability of the electronic part (semiconductor device or capacitor) were evaluated. The evaluation results are shown in Table 1.

Comparative Example 1

A curable silicone composition was prepared in the same manner as in Practical Example 1, except that the 0.5 parts by weight of 3-glycidoxypropyltrimethoxysilane and 0.5 parts by weight of a silanol-terminated dimethylsiloxane-methylvinylsiloxane copolymer used in Practical Example 1 were not added.

Using this curable silicone composition, the above mentioned adhesion of the cured sealing resin to the cured silicone resin and reliability of the electronic part (semiconductor device or capacitor) were evaluated. The evaluation results are shown in Table 1.

Comparative Example 2

A curable silicone composition was prepared in the same manner as in Practical Example 1, except that the 0.5 parts by weight of 3-glycidoxypropyltrimethoxysilane used in Practical Example 1 was not added.

Using this curable silicone composition, the above mentioned adhesion of the cured sealing resin to the cured silicone resin and reliability of the electronic part (semiconductor device or capacitor) were evaluated. The evaluation results are shown in Table 1.

(1)

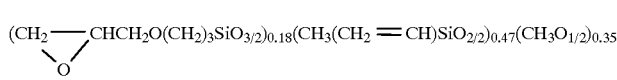

Comparative Example 3

A curable silicone composition was prepared in the same manner as in Practical Example 1, except that the 0.5 parts by weight of a silanol-terminated dimethylsiloxane-methylvinylsiloxane copolymer used in Practical Example 1 was not added.

Using this curable silicone composition, the above mentioned adhesion of the cured sealing resin to the cured silicone resin and reliability of the electronic part (semiconductor device or capacitor) were evaluated. The evaluation results are shown in Table 1.

TABLE 1

|  | Present Invention | | Comparative Examples | | |
| --- | --- | --- | --- | --- | --- |
|  | Pract. Ex. 1 | Pract. Ex. 2 | Comp. Ex. 1 | Comp. Ex. 2 | Comp. Ex. 3 |
| Adhesion of cured sealing resin to cured silicone resin | 0 | 0 | X | Δ | X |
| Reliability of semiconductor device (rate of defective operation following thermal cycle test) (%) | 0 | 0 | 10 | 5 | 10 |
| Reliability of capacitor (rate of defective operation following moisture resistance test) (%) | 0 | 0 | 10 | 5 | 5 |

In the electrical part of the present invention, a cured silicone resin which covers an electrical element is thoroughly bonded to and integrated with a cured sealing resin which covers said cured silicone resin. Accordingly, the electrical part of the present invention is characterized by superior reliability. Furthermore, the method of the present invention for manufacturing an electrical part is characterized by the fact that such an electrical part can be manufactured with good efficiency.

What we claim is:

1. An electrical part, comprising
   (1) an electrical element;
   (2) a cured silicone resin covering said electrical element, wherein said cured silicone resin is prepared by curing an addition reaction curable silicone composition comprising:
      (A) an organopolysiloxane having an average of at least two silicon-bonded alkenyl groups per molecule;
      (B) an organohydrogenpolysiloxane having an average of at least two silicon-bonded hydrogen atoms per molecule;
      (C) an addition reaction catalyst; and
      (D) a composition selected from the group consisting of
         I. a mixture of
            (a) an organosiloxane having silanol groups;
            (b) an epoxy group containing alkoxysilane; and
            (c) an organosiloxane having the average unit formula $(R^1SiO_{3/2})_a(R^2{}_2SiO_{2/2})_b(R^2{}_3SiO_{1/2})_c(R^3O_{1/2})_d$ wherein $R^1$ is an epoxy group containing monovalent organic group; each $R^2$ is individually selected from the group consisting of substituted and unsubstituted monovalent hydrocarbon groups; $R^3$ is a hydrogen atom or an alkyl group having 1 to 4 carbon atoms; a, b, and d are >0; and c is ≧0;
         II. a mixture of components (a) and (b);
         III. a mixture of components (a) and (c)
         IV. a reaction mixture of components (a), (b), (c);
         V. a reaction mixture of components (a) and (b); and
         VI. a reaction mixture of components (a) and (c); and
   (3) a cured sealing resin covering and integrally bonded to said cured silicone resin.

2. The electrical part claimed in claim 1, wherein component (1) is selected from the group consisting of semiconductor elements and capacitors.

3. The electrical part claimed in claim 1, wherein component (3) is a cured epoxy resin.

4. The electrical part claimed in claim 1, wherein the molar ratio of silicon bonded hydrogen atoms in component (B) to silicon-bonded alkenyl groups in component (A) is from 0.4 to 10.

5. The electrical part claimed in claim 4, wherein the molar ratio of silicon bonded hydrogen atoms in component (B) to silicon-bonded alkenyl groups in component (A) is from 0.5 to 3.

6. The electrical part claimed in claim 1, wherein component (a) is selected from the group consisting of silanol-terminated dimethylpolysiloxanes, silanol-terminated dimethylsiloxane-methylvinylsiloxane copolymers and silanol-terminated dimethylsiloxane-methylphenylsiloxane copolymers.

7. The electrical part claimed in claim 1, wherein component (b) is an alkoxysilane having the general formula $R^1Si(OR^4)_3$ wherein $R^1$ is an epoxy group containing monovalent organic group and $R^4$ is an alkyl group having 1 to 4 carbon atoms.

8. The electrical part claimed in claim 7, wherein component (b) is selected from the group consisting of 3-glycidoxypropyltrimethoxysilane, 2-(3,4-epoxycyclohexyl)ethyltrimethoxysilane, 4-oxiranylbutyltrimethoxysilane and 8-oxiranyloctyltrimethoxysilane.

9. The electrical part claimed in claim 8, wherein component (b) is 3-glycidoxypropyltrimethoxysilane.

10. The electrical part claimed in claim 1, wherein the weight ratio of component (a) to component (b) is 0.1:1 to 1:10.

11. The electrical part claimed in claim 1, wherein component $R^2$ is selected from the group consisting of alkyl groups, alkenyl groups, aryl groups, aralkyl groups, and halogenated alkyl groups.

12. The electrical part claimed in claim 11, wherein component $R^2$ is selected from the group consisting of methyl, vinyl and phenyl.

13. The electrical part claimed in claim 1, wherein the amount of component (D) is from 0.01 to 20 wt. % based on the weight of the addition reaction curable silicone composition.

14. The electrical part claimed in claim 1, wherein the amount of component (D) is from 0.1 to 10 wt. % based on the weight of the addition reaction curable silicone composition.

15. A method of manufacturing an electrical part, said method comprising the steps of:

(i) providing an electrical element;
(ii) covering the electrical part with an addition reaction curable silicone composition;
(iii) curing the addition reaction curable silicone composition to form a cured silicone resin;
(iv) irradiating the surface of the cured silicone resin with ultraviolet radiation; and
(v) resin sealing the ultraviolet irradiation treated cured silicone resin with a sealing resin;

wherein the addition reaction curable silicone composition comprises:

(A) an organopolysiloxane having an average of at least silicon-bonded alkenyl groups per molecule;
(B) an organohydrogenpolysiloxane having an average of at least two silicon-bonded hydrogen atoms per molecule;
(C) an addition reaction catalyst; and
(D) a composition selected from the group consisting of I. a mixture of
  (a) an organosiloxane having silanol groups;
  (b) an epoxy group containing alkoxysilane; and
  (c) an organosiloxane having the average unit formula

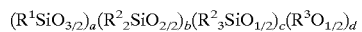

wherein $R^1$ is an epoxy group containing monovalent organic group; each $R^2$ is individually selected from the group consisting of substituted and unsubstituted monovalent hydrocarbon groups; $R^3$ is a hydrogen atom or an alkyl group having 1 to 4 carbon atoms; a, b, and d are>0; and c is$\geq$0;

II. a mixture of components (a) and (b);
III. a mixture of components (a) and (c)
IV. a reaction mixture of components (a), (b), (c);
V. a reaction mixture of components (a) and (b); and
VI. a reaction mixture of components (a) and (c).

16. The method of claim 15 wherein the ultraviolet radiation of step (iv) has an intensity of at least 0.1 j/cm$^2$ at 254 nm.

17. The method of claim 16 wherein the ultraviolet radiation of step (iv) has an intensity of 0.1 to 10 j/cm$^2$ nm.

* * * * *